April 20, 1971 E. M. CHESKIS ET AL 3,575,746
METHOD FOR FORMING RESISTIVE AND PHOTO-ETCHED RESISTIVE
AND CONDUCTIVE GLAZE PATTERNS
Filed Dec. 12, 1967

INVENTOR
EUGENE M. CHESKIS
FRANKLYN M. COLLINS
BY
ATTORNEY

United States Patent Office 3,575,746
Patented Apr. 20, 1971

3,575,746
METHOD FOR FORMING RESISTIVE AND PHOTO-ETCHED RESISTIVE AND CONDUCTIVE GLAZE PATTERNS

Eugene M. Cheskis, Scottsdale, Ariz., and Franklyn M. Collins, Lewiston, N.Y., assignors to Air Reduction Company, Incorporated, New York, N.Y.
Filed Dec. 12, 1967, Ser. No. 690,014
Int. Cl. C23f *1/02;* H05k *1/00, 3/00*
U.S. Cl. 156—8 8 Claims

ABSTRACT OF THE DISCLOSURE

Precision microminiature electroconductive patterns are formed on a refractory substrate by overcoating the substrate with a thin electroconductive glaze and photoetching the glazed layer to yield the desired pattern.

The invention described herein was made in the course of or under a contract with the Department of the Navy.

BACKGROUND OF THE INVENTION

This invention relates generally to printed circuits and more specifically to methodology for forming on suitable substrates extremely accurate miniaturized conductive patterns.

Within recent years an enormous amount of time and effort has been expended in the development of microelectronic technology. That phase of these efforts which has been associated with development of passive circuit elements such as resistors and capacitors has been correspondingly intense, and much progress has been made in those arts—such as thin film technology—which have found application to the new circuit designs. The various techniques that have been developed for laying down precision patterns of conductors and resistors have not only been utilized to produce patterns on insulated substrates for association with miniaturized components, but have also been adapted for use with active substrates, whereby the same or similar methods find application in production of integrated circuits.

Basically, all of the aforementioned techniques for forming passive microcircuit elements are based upon intermediate use of photoetching methods, in that the precision necessary to produce the deposited microcircuitry can only be achieved through optical means. In order to form a given passive network, it has been customary to first vacuum deposit a thin layer or film of the metallic material destined to comprise the network upon a suitable substrate. Thereafter, a layer of photopolymerizable material is applied to the thin metal film and the combination is exposed to light through an optical mask in the pattern of the desired network. As a result of such procedure, the photopolymer layer is hardened in selected areas whereby an appropriate solvent can effect (by dissolution) removal of the non-hardened layer from portions of the conductive layer other than those defining the network. An acidic or basic bath may then be applied which dissolves away the exposed conductive material and leaves the network beneath its protective polymer covering. The latter is then removed by a special stripping solution to leave the finished conductive network.

The difficulties with the foregoing procedure are many, In the first place, such procedure requires that at some point or other a uniform thin film of the metal comprising the network material be vacuum deposited on the substrate. While techniques to deposit such metal films are well-known, they are technically sophisticated and require extensive investment in equipment and personnel training. Sputtering and flash evaporation techniques are two typical examples illustrating this point.

Secondly, the variety of metallic compositions available for such networks is limited to those which are effective when applied by the methods alluded to above of thin film production. The range and variety of good resistive compositions is, in particular, quite limited. Were effective higher resistance films available, a highly desired reduction in the dimensions of the microcircuitry would be possible.

In accordance with the foregoing, it may be regarded as an object of the present invention to provide a method for establishing precision conductive patterns on both active and passive substrates.

It is another object of the present invention to provide a method whereby conductive patterns may be formed on suitable substrates with great precision and reproducibility, yet by simple techniques which obviate the need for vacuum deposition of thin metal films.

It is an additional object of the invention to provide a method for formation of conductive patterns utilizing photoetching, wherein etching occurs in a medium displaying a very precise etching response, whereby patterns of extreme uniformity and reduced size become possible.

It is a further object of the invention to provide a method pursuant to which precision resistive patterns may be formed by the exacting means of photoetching in a film medium displaying resistances higher than film media previously so treated, whereby a great reduction in size of the said pattern may be effected.

A further object of the invention is to provide a method for forming higher value resistors so that low power circuits may be used without requiring excessive amounts of substrate area.

It is a yet further object of the present invention to provide a method for formation of conductive patterns on active and passive substrates which enables use of a great variety of materials for the conductive pattern, and which further, enables combination in the pattern of segments possessing varying preselected conductivities.

SUMMARY OF INVENTION

Now in accordance with the present invention, the foregoing objects, and others, as will become apparent in the course of the ensuing specification, are achieved by a process wherein refractory substrates intended for reception of precise conductive patterns are overcoated by simple screening techniques, spraying, dipping, or the like with electroconductive pastes of the type including a dispersed conductive phase and a binding glass phase. Subsequent firing of the paste-bearing substrate provides a uniformly glazed conductive film which is fused to the refractory substrate, to provide an integral and stable unitized structure. The conductive glaze film is then overcoated with a photopolymerizable film and the desired conductive pattern is photoetched into the glaze by standard techniques. While the method set forth is obviously applicable to overglazed substrates comprising glass, ceramic, or the like, it may in a modified form be employed with active substrates—such as silicon or germanium wafers—by merely passivating the active substrate prior to application of the conductive pastes.

BRIEF DESCRIPTION OF THE DRAWINGS

A fuller understanding of the present invention, of the manner in which the invention achieves the objects previously recited, and of the invention's multiple advantages as compared to the prior art, may now best be gained by a reading of the following detailed specification, and by a simultaneous examination of the drawings appended hereto, in which.

DETAILED DESCRIPTION OF PREFERRED EMBODIMENT

FIGS. 1 through 5 illustrate the sequential operations which, in accord with the present invention, produce a desired conductive pattern. As will become apparent in the ensuing specification, the phrases "conductive" (as used here) or "electroconductive" (as used elsewhere) will designate compositions and ceramic-like products possessing resistivities of the order of .005 ohm/square or higher, and are thus intended to encompass not only substances normally regarded as conductors, but also substances nominally identified as resistors—provided only that where such compositions are "resistive," they display sufficient unformity in electrical properties to make them useful as electrical resistors.

Figure 1:
FIGS. 1 through 5 graphically depict the sequence of operations involved in preparing a conductive pattern-bearing substrate by practice of the present invention.

In FIG. 1 a substrate 1 is shown upon which the conductive pattern will ultimately be established. For purposes of concretely illustrating the invention, it may be assumed that substrate 1 is a refractory ceramic or glass material; typically, the substrate will comprise a so-called "thin film substrate," numerous types of which are commercially available from such sources as the American Lava Division of 3M Company or the Coors Ceramic Division of Adolph Coors, Inc. As will be shown subsequently, the substrate 1 may also be an active material—such as a silicon or germanium wafer—however, the invention is more simply illustrated for the passive case. Again, for purposes of illustrating the invention, it may be further assumed that active devices such as transistors, diodes, etc. may ultimately be deposited on the illustratively inert substrate—by for example affixing a modular chip containing integrated circuits or the like to the substrate—and that for such reason it is desired to establish a precise conductive network on the substrate which will provide interconnections, biasing, etc. to the active circuit elements.

In practice of the present invention it will normally be preferable to place terminations on substrate 1 before applying the resistive or conductive films. A suitable method for depositing the metals for the terminations is by evaporating a thin layer of aluminum and then a conductive overlayer of gold. (The aluminum improves the adherence of the gold to the substrate.) Both layers are then photoetched, e.g. with aqua regia, into a suitable termination geometry. In the interest of simplicity, the terminations are not explicitly shown in FIGS. 1 through 6.

As shown in FIG. 1, an electroconductive glaze paste layer 2 is now applied to substrate 1. The pastes utilized in the present invention do not per se form part of the present invention. Typically, they will comprise dispersions of metals, conductive oxides, semi-conductors, etc. in glass frit matrices including miscellaneous added inert materials and/or temporary binders. Essentially resistive compositions of this type are disclosed, for example, in U.S. Pats. 3,238,151; 3,052,573; 2,837,487; 3,154,503; 3,329,526. Higher conductivity paste compositions are also widely known. A large number of such higher conductivity pastes are, for example, commercially available from the Dupont Company of Wilmington, Del., under such product number designations as 7553 (platinum-gold-glass), 6998 (platinum-silver-glass), and 6730 (silver-glass). All of the foregoing compositions are characterized by the fact that firing thereof yields a thoroughly uniform glazed product, which externally resembles glass or a ceramic. Depending upon the specific composition utilized, resistive (or conductive) properties, electric or thermal stability, etc. may almost be tailored at will.

Layer 2 can be deposited upon substrate 1 in numerous ways, the preferred method being screen printing. In order to achieve the very thin layers desirable for higher resistance properties, certain alterations may be necessary in the usual methods used to make screenable resistor pastes. In practice, for example, it has been found that formation of very uniform thin layers is facilitated by utilizing large amounts of screening agents, higher pressure roll mills for grinding and dispensing the paste, and printing the paste through a finer mesh screen than is customarily used:

Example I

A resistive paste of the type disclosed in the Kim Pat. 3,238,151, previously alluded to, was prepared by mixing together weighed out portions of conductor ($Tl_2O_3$), glass, and a screening agent comprising ethyl cellulose in butyl carbitol mixed to have a viscosity of 150 centipoise. One part of screening agent was used with five parts, total, of conductor and glass. (In other instances the ratio of screening agent to powder has varied up to 1:1.) To this was added a quantity of butyl carbitol solvent, to the extent of several milliliter to twenty grams of the other ingredients. The mixture was ground in an automatic mortar for an hour and then passed thirty times through a 3-roll paint mill. The paste was then screen printed through a 165 stainless steel mesh using a semi-automatic AMI laboratory printer, Model MA–12(a) (200 and even 400 mesh screens have been used with the thinner paste that result where higher ratios of screening agents to powder are present). The prints were permitted to settle for ten minutes, after which most of the solvent was vaporized in a drying oven. The sample was then ready for firing.

Figure 2:
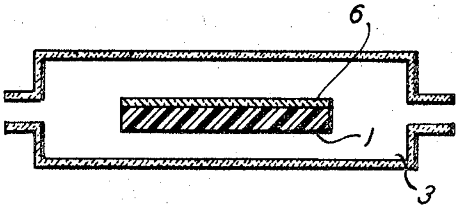

Firing of electroconductive paste layer 2 is diagrammatically depicted in FIG. 2, wherein the paste-bearing substrate is shown within the oven 3. The particular time and temperature utilized in this step will vary, depending upon the particular paste utilized, and upon the particular conductive properties desired. For the thallium oxide-glass composition of Example I, e.g. exposure of about 30 minutes to firing temperature around 550° C. have been found quite effective in producing high quality, uniformly resistive layers of thicknesses as low as 1½ to 4 microns, which layers have been found to exhibit sheet resistivities in the range of from below one kilohm to over one megohm per square. Because the process up to the present point involves only relatively simple screen printing and firing apparatus, it is quite practical—in contradistinction to the vapor deposition methods previously used for depositing thin metal films—to prepare at one time large batches of the electroconductive pastes being utilized, and establish a simple conveyor belt production line for overcoating and firing substrates on a large scale basis.

Figure 3:
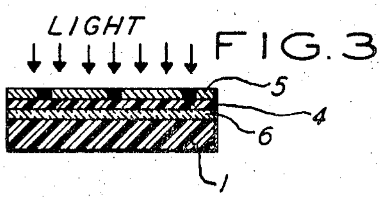
Figure 4:
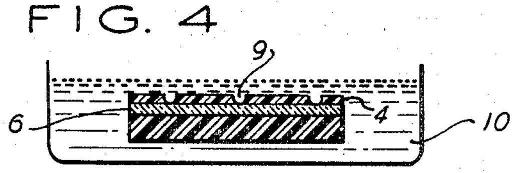

The overglazed substrate 1 is now ready for the photoetching subprocess depicted in FIGS. 3 and 4. Initially, a thin layer 4 of photopolymerizable material is applied over glaze 6 and the layer 4 is exposed to actinic radiation in the pattern of the desired conductive network. This aspect of the invention represents in itself a quite conventional technique in that it is well-known to those skilled in the art to employ a coating of so-called photo-resists to photoetch thin films or the like. Thus, in the present instance, layer 4 may conveniently comprise the well-known Kodak Photo Resist (KPR), a commercial product available from the Eastman Kodak Company of Rochester, N.Y.; similarly varying mixtures of KPR and styrene monomer may be employed for layer 4, with or without added photosenstizing dyes. Exposure of layer 4 is made via any convenient technique, such as by exposing the layer 4 to actinic radiation through the contacting mask 5 which bears the desired pattern.

After sufficient exposure is present to photopolymerize portions of the layer 4 upon which light incidence occurs, the layer 4—again as is conventional in photoetching art—is subjected to a solvent which selectively dissolves away the unpolymerized portions of the layer, which portions correspond to dark (occluded) portions of mask 5. The solvent used for such purposes may be any of various organic solvents, such as for example, toluene, or xylene, or the KPR layer may be selectively dissolved by Kodak Photo Resist Developer, a commercial solvent sold for this purpose by the Eastman Kodak Company. As a result of such selective dissolution, the structure now appears as in FIG. 4 with a series of voids 9 in layer 4, corresponding to the dark lines present on mask 5. The pattern of such voids will be the negative of the conductive pattern to be formed on substrate 1.

Substrate 1 selectively bearing the covering of layer 4 is now subjected to an etchant, as by the chemical etchant bath 10 of FIG. 4 which acts upon glaze 6 to precisely remove underlying portions of the glaze corresponding to the voids 9 in layer 4.

The particular etching technique used upon glaze 6 will be chosen in accord with the actual constitution of the glaze. In some instances, for example, a simple buffered solution of hydrofluoric acid may be used to effect the desired dissolution; or more sophisticated methodology may be utilized. The following examples are illustrative of techniques that have proved useful in effecting accurate etching of the essentially two-phase composition of thallium-oxide and glass—referred to in Example I.

Example II

In this case, etching was primarily directed at the conductor. Specifically, it was found that in a sample prepared in accordance with Example I and FIGS. 3 and 4, the thallium oxide could be readily removed from glaze 6 by using a dilute hydrochloric acid solution, 1 part acid to 50 parts water. The glass remaining at the etched portions of the glaze was readily removable by simple rubbing.

Example III

In this instance, concurrent etching of the thallium oxide and borosilicate glass phases was effected. The etchant solution utilized comprised 3 parts water, 1 part hydrofluoric acid, 1 part nitric acid, and 1 part hydrochloric acid.

Example IV

Again beginning with the same $Tl_2O_3$-glass film of the previous examples, two etchants were used, one for each phase in the film. The thallium oxide was etched first, using hydrochloric acid, diluted one part to twenty parts of water. After approximately twenty seconds it was visually apparent that most of the thallium oxide had been removed from the desired areas. The sample was then water rinsed and immersed in warm caustic (NaOH at 90° C.). In approximately five seconds it was visually apparent that the glass had been removed from the desired area. This was followed by a water rinse and by a short immersion in the thallium oxide etch as a cleanup.

In all of the above examples it was found that excellent results were achievable where photopolymerizable layer 4 comprised the Kodak products KTFR (negative) or AZ 1350 (positive), in that these products possessed more than adequate resistance to the chemical employed, and moreover displayed sufficient line resolution to enable full advantage to be taken of the excellent etching qualities of the glazes. Thus, it was found in these examples that lines could be effectively etched in the glazes down to widths as small as 0.5 mil.

Figure 5:
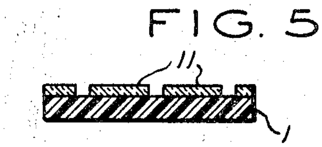

Upon completion of the etching operation, remaining portions of the layer 4 are removed from glaze 6. Commonly, this may be achieved by application thereto of a suitable solvent, such as the stripping solution marketed by Eastman Kodak Company for such purposes; however, in the case of the negative photoresist (KTFR) referred to above, it was found that removal could also be achieved by charring at suitable temperatures. The substrate 1 now bearing the fine glazed conductive pattern 11 is shown at FIG. 5.

Figure 6:
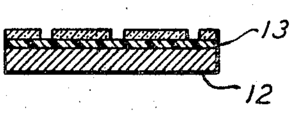
FIG. 6 shows an active substrate bearing a conductive pattern established by the present process, and illustrates how the process is modified in such instances.

FIG. 6 diagrammatically suggests how the same technique as has been described in connection with FIGS. 1 through 5 for the case where a passive substrate is utilized, may be modified for use with an active substrate. Substrate 12 in FIG. 6 may thus be regarded as a typical active substrate—such as for example a silicon or germanium semiconductor chip. Essentially, it has now been found that the same techniques described for preparation of pattern 11 on the passive device may be used with the active device, provided that passivation of the semiconductor is first undertaken. The required passivation may, for example, be effected by providing an intermediate inert layer 13 which acts to electrically isolate substrate 12 from conductive pattern 11.

Example V

Silicon wafers were obtained and silica films about one micron thick were formed on the surface of several wafers, both by thermal oxidation and by the pyrolytic decomposition of tetraethylorthosilicate (TEOS). A relatively standard screenable paste containing 54 w/o $Tl_2O_3$ and 46 w/o glass (Harshaw Q12) was fired on the surface of the various wafers. The samples were fired on a 45 minute cycle with the furnace set for a maximum temperature of 545° C. The resulting glazes were of the order of less than .2 mil thick, with effective electrical isolation of the glaze from silicon being achieved.

Since substrate 12 may contain active diffused elements, photoetching techniques may optionally be employed after the application of passivating layer 13 to provide openings in layer 13 at which low resistance contact between pattern 11 and such active elements may occur. In connection with this allusion to active diffused elements, it should be noted that one of the great advantages of utilizing the present methods with active substrates—such as at 12—derives from the fact that the pastes employed in the invention commonly incorporate low melting point glasses, such as borosilicate and phosphate frits for binders. See in this connection e.g., the Kim Patent 3,238,151 previously cited. As both layer 13 and the pastes 2 will accordingly require comparatively low temperature firing, a unitized entirely ceramic-like structure can be produced on an active silicon, germanium or other semiconductor substrate without subjecting the latter to temperatures high enough to disturb active elements which have already been diffused into the semiconductor.

While the present invention has been described in terms of specific embodiments thereof, it will be understood in view of the instant disclosure, that numerous variations thereon and modifications thereof may now be readily devised by those skilled in the art without yet departing from the present teaching. For example, even though the present invention has been illustratively described in terms of utilizing a single electroconductive paste for purposes of establishing the glaze destined to comprise the conductive network, it will be clear that the simple process by which the paste is applied to the substrates is such that a variety of paste compositions might be used to cover various portions of the substrate surface, by merely employing masks, etc. to block off first one and then other sections of the substrate surface. As a result of such procedure, one may derive a network pattern in which varying segments thereof display different preselected conductivities. Accordingly, the present invention is to be construed broadly and limited in scope only by the claims now appended hereto.

We claim:

1. A method for forming a conductive pattern on an inert substrate which comprises forming a uniform thin electroconductive glaze film on said substrate, and selectively etching said film to yield said pattern, said film being formed on said substrate by firing thereupon a mixture including a conductive oxide and a glass binder to yield a uniform glaze having a glass and a conductive phase, and the etching of said glaze film being effected by covering only portions of said film corresponding to said pattern with an etchant-resistant coating, contacting the exposed glaze with a first etchant for said conductive phase, and then contacting said exposed glaze with a second etchant for said glass phase.

2. A method according to claim 1 wherein said substrate is a passivated semiconductor.

3. A method according to claim 1 wherein said conductive oxide comprises thallium oxide, and said glass binder is a borosilicate glass.

4. A method according to claim 3 wherein said mixture is applied to said substrate by screen printing said mixture thereon in a layer thickness below four microns.

5. A method for etching an electroconductive glaze including a fired glass matrix phase and a dispersed conductive phase, comprising: contacting the glaze with a first etchant for said conductive phase, and then contacting said glaze with a second etchant for said glass phase.

6. A method according to claim 5 wherein said glaze comprises a conductive thallium oxide phase dispersed in a borosilicate glass phase, and wherein said first etchant comprises a dilute solution of hydrochloric acid and said second etchant comprises a warm solution of sodium hydroxide.

7. A method for forming a miniaturized resistive pattern on an insulated surface comprising: screen printing and firing onto said surface a less than four micron layer of a uniform glaze comprising a thallium oxide phase dispersed in a glass binder phase, covering only portions of said film corresponding to said pattern with an etchant-resistant coating, and then contacting said exposed glaze with an etchant which effects concurrent etching of said thallium oxide and said glass phases.

8. A method for forming a miniaturized resistive pattern on an insulated surface comprising: screen printing and firing onto said surface a less than four micron layer of a uniform glaze comprising a thallium oxide phase dispersed in a glass binder phase, covering only portions of said film corresponding to said pattern with an etchant-resistant coating, and then contacting said exposed glaze with etchant baths which effect sequential etching of said thallium oxide and said glass phases.

References Cited

UNITED STATES PATENTS

| | | | |
|---|---|---|---|
| 3,052,573 | 9/1962 | Dumesnil | 117—221 |
| 3,226,611 | 12/1965 | Haenichen | 317—234 |
| 3,404,032 | 10/1968 | Collins | 252—518X |
| 3,415,680 | 12/1968 | Perri et al. | 117—215X |
| 3,460,003 | 8/1969 | Hampikian et al. | 117—212X |

WILLIAM A. POWELL, Primary Examiner

U.S. Cl. X.R.

117—212; 156—16, 17; 174—68.5; 252—79.2, 518